United States Patent
Zhang

(10) Patent No.: US 11,972,828 B2
(45) Date of Patent: Apr. 30, 2024

(54) REPAIR CIRCUIT, MEMORY, AND REPAIR METHOD

(71) Applicant: CHANGXIN MEMORY TECHNOLOGIES, INC., Anhui (CN)

(72) Inventor: Liang Zhang, Hefei (CN)

(73) Assignee: Changxin Memory Technologies, Inc., Anhui (CN)

( * ) Notice: Subject to any disclaimer, the term of this patent is extended or adjusted under 35 U.S.C. 154(b) by 261 days.

(21) Appl. No.: 17/477,769

(22) Filed: Sep. 17, 2021

(65) Prior Publication Data

US 2022/0005544 A1  Jan. 6, 2022

Related U.S. Application Data

(63) Continuation of application No. PCT/CN2021/073269, filed on Jan. 22, 2021.

(30) Foreign Application Priority Data

Feb. 24, 2020 (CN) .......................... 202010111701.8

(51) Int. Cl.
*G11C 29/00* (2006.01)
*G11C 29/38* (2006.01)
(Continued)

(52) U.S. Cl.
CPC .............. *G11C 29/76* (2013.01); *G11C 29/38* (2013.01); *G11C 29/4401* (2013.01); *H03K 19/20* (2013.01); *G11C 2029/1202* (2013.01)

(58) Field of Classification Search
CPC ..... G11C 29/76; G11C 29/38; G11C 29/4401; G11C 2029/1202; G11C 2029/0409;
(Continued)

(56) References Cited

U.S. PATENT DOCUMENTS 6,556,065 B1    4/2003  Keeth
6,967,896 B2 *  11/2005 Eisen ..................... G11C 16/10
                                                          365/185.03
(Continued)

FOREIGN PATENT DOCUMENTS

CN    109872763 A    6/2019
CN    109935268 A    6/2019
(Continued)

OTHER PUBLICATIONS

Supplementary European Search Report in the European application No. 21761667.1, dated Apr. 28, 2022, 8 pgs.
(Continued)

*Primary Examiner* — Khamdan N. Alrobaie
(74) *Attorney, Agent, or Firm* — Cooper Legal Group, LLC

(57) ABSTRACT

The repair circuit is disposed in a memory including a normal memory area and a redundant memory area including a target repair unit immediately adjacent to the normal memory area, and the repair circuit being configured to control the target repair unit to repair an abnormal memory cell in the normal memory area. The repair circuit includes: a first control circuit, configured to receive signals at a target number of bits from low to high in a row address, process the received signals to obtain a control result, and output the control result, where the target number is associated with a number of Word Lines in the target repair unit; and a repair determination circuitry, connected to an output terminal of the first control circuit, and configured to receive the control result and output, in combination with the control result, a repair signal indicating whether to perform a repair operation.

18 Claims, 10 Drawing Sheets

(51) Int. Cl.
*G11C 29/44* (2006.01)
*H03K 19/20* (2006.01)
*G11C 29/12* (2006.01)

(58) Field of Classification Search
CPC ....... G11C 29/52; G11C 29/72; G11C 29/783; G11C 29/785; G11C 29/804; G11C 29/81; G11C 29/44; H03K 19/20
See application file for complete search history.

(56) References Cited

U.S. PATENT DOCUMENTS

| | | | | |
|---|---|---|---|---|
| 8,085,573 | B2* | 12/2011 | Shiratake | G11C 11/22 365/210.1 |
| 10,013,305 | B2 | 7/2018 | Lim et al. | |
| 10,825,546 | B2 | 11/2020 | Nakaoka | |
| 2005/0270841 | A1* | 12/2005 | Merritt | G11C 29/81 365/185.09 |
| 2009/0109773 | A1 | 4/2009 | Abe | |
| 2010/0002530 | A1* | 1/2010 | Blodgett | G11C 29/787 365/225.7 |
| 2015/0340077 | A1 | 11/2015 | Akamatsu | |
| 2018/0113755 | A1* | 4/2018 | Lim | G11C 29/787 |
| 2018/0158504 | A1 | 6/2018 | Akamatsu | |
| 2019/0013059 | A1 | 1/2019 | Akamatsu | |
| 2019/0172547 | A1 | 6/2019 | Yun et al. | |
| 2019/0189240 | A1* | 6/2019 | Kim | G11C 29/81 |
| 2019/0304565 | A1* | 10/2019 | Kim | G11C 29/846 |
| 2019/0385667 | A1 | 12/2019 | Morohashi et al. | |
| 2020/0027522 | A1* | 1/2020 | Nakaoka | G11C 29/44 |
| 2020/0081782 | A1* | 3/2020 | Eichmeyer | G11C 29/42 |
| 2020/0194050 | A1 | 6/2020 | Akamatsu | |
| 2021/0350844 | A1 | 11/2021 | Morohashi et al. | |

FOREIGN PATENT DOCUMENTS

| | | |
|---|---|---|
| CN | 110322923 A | 10/2019 |
| CN | 210925503 U | 7/2020 |

OTHER PUBLICATIONS

International Search Report in the international application No. PCT/CN2021/073269, dated Apr. 27, 2021, 2 pgs.

* cited by examiner

REPAIR CIRCUIT, MEMORY, AND REPAIR METHOD

CROSS-REFERENCE TO RELATED APPLICATION

This is a continuation application of International Patent Application No. PCT/CN2021/073269, filed on Jan. 22, 2021, which claims priority to Chinese Patent Application No. 202010111701.8, filed on Feb. 24, 2020 and entitled "REPAIR CIRCUIT, MEMORY, AND REPAIR METHOD". The disclosures of International Patent Application No. PCT/CN2021/073269 and Chinese Patent Application No. 202010111701.8 are incorporated by reference herein in their entireties.

TECHNICAL FIELD

The disclosure relates to the technical field of semiconductor memories, and more particularly, to a repair circuit, a memory, and a repair method.

BACKGROUND

Dynamic Random Access Memory (DRAM) arrays are typically stored to a normal memory area and a redundant memory area. In a case where a memory cell of the normal memory area cannot provide the normal read-write or storage function, a memory cell of the redundant memory area may be used to replace the abnormal memory cell, thereby ensuring normal work of the memory.

Concerning a row redundancy, due to the row hammer problem, a memory cell closest to the normal memory area in the redundant memory area cannot be used, which causes the loss of resources in the redundant memory area and reduces the utilization rate of the redundant memory area.

It is to be noted that the information disclosed in the background section is merely for the purpose of enhancing the understanding on the background of the disclosure and thus may include information which does not constitute related art known to those of ordinary skill in the art.

SUMMARY

An objective of the disclosure is to provide a repair circuit, a memory, and a repair method, so as to at least overcome, to some extent, the reduction in the utilization rate of the redundant memory area due to the memory cell closest to the normal memory area in the redundant memory area cannot be used.

In a first aspect of the disclosure, a repair circuit is provided, which is disposed in a memory including a normal memory area and a redundant memory area, the redundant memory area including a target repair unit immediately adjacent to the normal memory area, and the repair circuit being configured to control the target repair unit to repair an abnormal memory cell in the normal memory area. The repair circuit includes a first control circuit and a repair determination module. The first control circuit is configured to receive signals at a target number of bits from low to high in a row address, process the signals at the target number of bits to obtain a control result, and output the control result. The target number is associated with a number of Word Lines (WLs) in the target repair unit. The repair determination module is connected to an output terminal of the first control circuit, and configured to receive the control result and output, in combination with the control result, a repair signal indicating whether to perform a repair operation.

Optionally, the repair determination module may include: a comparison circuit, configured to receive signals at rest bits other than the target number of bits in the row address, receive a fuse address, compare the signals at the rest bits with the fuse address bit by bit to obtain multiple comparison results, and output the multiple comparison results; and a second control circuit, connected to the output terminal of the first control circuit and an output terminal of the comparison circuit, and configured to receive the control result and the multiple comparison results, process the control result and the multiple comparison results, and output the repair signal indicating whether to perform the repair operation.

Optionally, the first control circuit may include: the target number of NOT gates, an input terminal of each of the target number of NOT gates receiving a respective one of the signals at the target number of bits from low to high in the row address; and an NAND gate, an input terminal of the NAND gate being connected to an output terminal of each of the target number of NOT gates, and an output terminal of the NAND gate being connected to the second control circuit, and configured to output the control result.

Optionally, the comparison circuit may include: multiple XNOR gates, a number of the multiple XNOR gates being the same as the number of the signals at the rest bits other than the target number of bits in the row address, a first input terminal of each of the multiple XNOR gates receiving a respective one of the signals at the rest bits other than the target number of bits in the row address, a second end of the each XNOR gate receiving a corresponding bit of the fuse address, and an output terminal of the each XNOR gate outputting a respective one of the multiple comparison results.

Optionally, the second control circuit may include: an AND gate, multiple first input terminals of the AND gate being connected to output terminals of the multiple XNOR gates, respectively, a second input terminal of the AND gate being connected to the output terminal of the NAND gate, and an output terminal of the AND gate outputting a repair signal indicating whether to perform the repair operation.

Optionally, when a number of WLs in the target repair unit is $2^n$, the target number is n, the n being a positive integer greater than or equal to 2.

Optionally, when the signals at the target number of bits are all at a low level, the repair determination module outputs a repair signal indicating that no repair operation is to be performed.

According to a second aspect of the disclosure, a memory is provided, which includes: a normal memory area; a redundant memory area, including a target repair unit immediately adjacent to the normal memory area; a row address receiving end, configured to receive a row address input to the memory; and the above any repair circuit.

Optionally, the memory may further include: a fuse address storage module, configured to store an address of a WL corresponding to an abnormal memory cell in the normal memory area as a fuse address, where the repair circuit is configured to receive the fuse address, so as to output a repair signal indicating whether to perform a repair operation.

Optionally, in a storage unit, corresponding to the target repair unit, of the fuse address storage module, an address of a first WL in the abnormal memory cell is not stored.

According to a third aspect of the disclosure, a repair method is provided, which is applied to a memory including a normal memory area and a redundant memory area, the redundant memory area including a target repair unit immediately adjacent to the normal memory area, and the repair method including that: a row address input to the memory is received; a control result is obtained according to signals at a target number of bits from low to high in the row address, where the target number is associated with a number of WLs in the target repair unit; and in combination with the control result, the target repair unit is controlled to repair an abnormal memory cell in the normal memory area.

Optionally, the operation that in combination with the control result, the target repair unit is controlled to repair the abnormal memory cell in the normal memory area may include that: signals at rest bits other than the target number of bits in the row address are determined; a fuse address corresponding to the abnormal memory cell in the normal memory area is received; the signals at the rest bits are compared with the fuse address bit by bit to obtain multiple comparison results; and according to the multiple comparison results and the control result, the target repair unit is controlled to repair the abnormal memory cell in the normal memory area.

Optionally, when the multiple comparison results are that each of the signals at the rest bits is matched with a corresponding bit of the fuse address, the operation that according to the multiple comparison results and the control result, the target repair unit is controlled to repair the abnormal memory cell in the normal memory area may include that: when at least one signal among the signals at the target number of bits from low to high in the row address is at a high level, the abnormal memory cell is repaired with the target repair unit; and when the signals at the target number of bits from low to high in the row address are all at a low level, the abnormal memory cell is repaired with a repair unit other than the target repair unit in the redundant memory area.

Optionally, the operation that the abnormal memory cell is repaired with the target repair unit may include that: a WL corresponding to the abnormal memory cell is replaced with a rest WL other than a first WL in the target repair unit; and a first WL of the abnormal memory cell is retained, where the first WL of the target repair unit is a WL adjacent to the normal memory area.

In the technical solutions provided by some embodiments of the disclosure, the repair circuit includes a first control circuit and a repair determination module, the first control circuit is configured to receive signals at the target number of bits from low to high in a row address and output a control result, and the repair determination module outputs, in combination with the control result, a repair signal indicating whether to perform a repair operation. Whether the target repair unit immediately adjacent to the normal memory area in the redundant memory area is used to perform the repair operation is determined with information of the row address, that is, when the information of the row address meets the requirements, the target repair unit may be used to replace the abnormal memory cell. Therefore, compared with the solution in which the target repair unit is not used for repair in some technologies, the exemplary embodiment of the disclosure may improve the utilization rate of the redundant memory area.

It is to be understood that the above general descriptions and detailed descriptions below are only exemplary and explanatory and not intended to limit the disclosure.

BRIEF DESCRIPTION OF THE DRAWINGS

The accompanying drawings, which are incorporated in and constitute a part of this specification, illustrate embodiments consistent with the disclosure and, together with the description, serve to explain the principles of the disclosure. It is apparent that the accompanying drawings in the description below are merely some of the embodiments of the disclosure, based on which other drawings may be obtained by a person of ordinary skill in the art without any creative effort. In the drawings.

DETAILED DESCRIPTION

Figure 1:
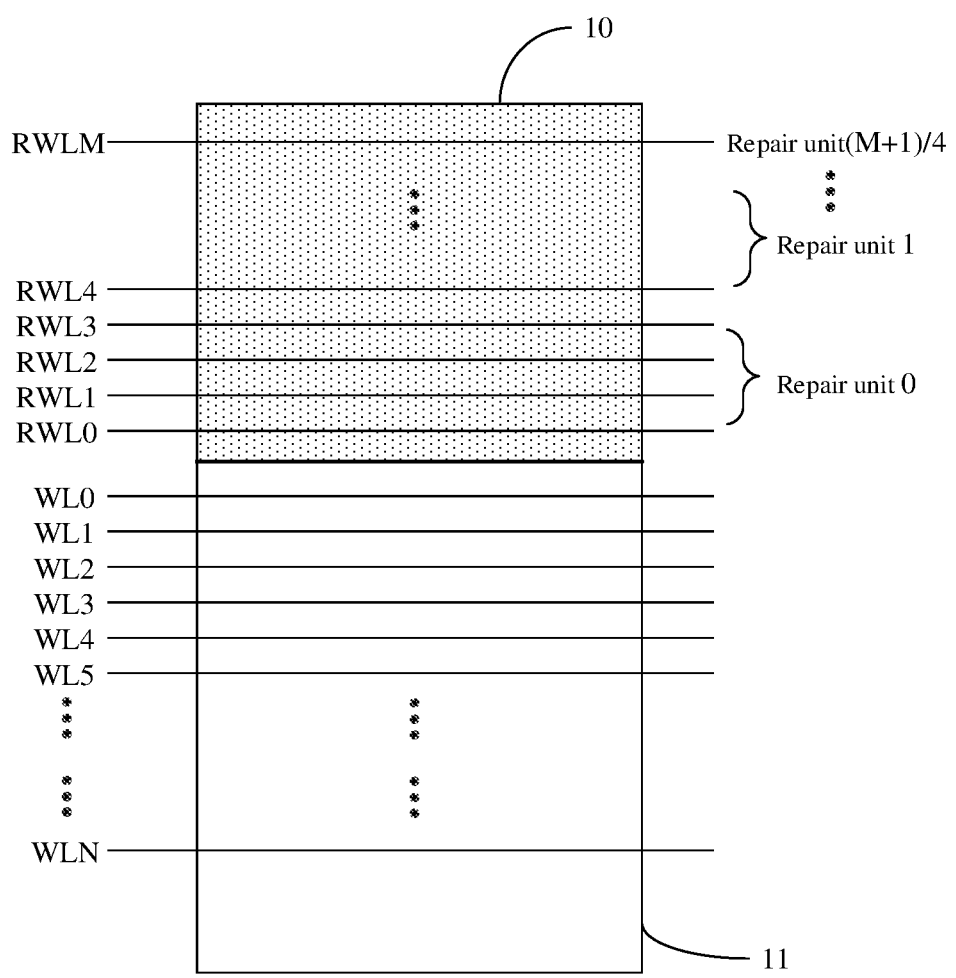
FIG. 1 illustrates a schematic diagram of a memory array according to an exemplary embodiment of the disclosure.

Exemplary embodiments will now be described more fully with reference to the accompanying drawings. However, the exemplary embodiments may be implemented in various forms and should not be understood as being limited to the examples set forth herein; rather, these embodiments are provided to make the disclosure more thorough and complete, and to fully convey the concepts of the exemplary embodiments to those skilled in the art. The features, structures or characteristics described herein may be combined in one or more embodiments in any suitable manner. In the following description, numerous specific details are provided to offer a thorough understanding on the embodiments of the disclosure. However, it will be recognized by those skilled in the art that the technical solution of the disclosure may be practiced without one or more of the specific details, or that other methods, components, devices, steps, and the like may be employed. In other instances, well-known technical solutions are not shown or described in detail to avoid obscuring aspects of the disclosure.

In addition, the drawings are merely schematic representations of the disclosure and are not necessarily drawn to scale. The same reference numerals in the drawings denote the same or similar parts, and repetitive description thereof will be omitted.

In manufacture of the DRAM, the increasingly higher accuracy and the increasingly smaller size require that more structures are integrated on one chip. In this case, interference easily occurs between memory cells, and the row hammer phenomenon may occur.

The row hammer may be understood as that when one Word Line (WL) is intensively accessed (for example, repeated read and write operations or maliciously attacked), charges stored in an adjacent memory cell may be affected to change from 0 to 1 or from 1 to 0, and such a random flipping will cause errors in the storage data. It is easily understood by those skilled in the art that the WL used herein is usually used for controlling an on-off state of a memory cell. For example, when the WL is at a high level, the corresponding memory cell is on; and when the WL is at a low level, the corresponding memory cell is off.

In addition, with regard to the DRAM repair solution, when a memory cell in the normal memory area is abnormal, a repair unit in the redundant memory area may be used for repair. In view that the number of control circuits is restricted and multiple continuous WLs may be damaged at the same time in actual damage, the usual repair process is to use multiple continuous WLs in the redundant memory area to replace the abnormal WLs at the same time. The multiple continuous WLs correspond to one repair unit.

In some technologies, during configuring the repair solution of the memory, a repair unit adjacent to the normal memory area in the redundant memory area is not used. Hence, the influence of the adjacent repair unit on the normal memory area is avoided, and the row hammer problem is solved to some extent.

As illustrated in FIG. 1, the memory in the exemplary embodiment of the disclosure may include a normal memory area 11 and a redundant memory area 10. The normal memory area 11 includes N+1 WLs in total such as WL0, WL1, WL2, . . . , WLN. The redundant memory area 10 includes M+1 WLs in total such as RWL0, RWL1, RWL2, . . . , RWLM. The M is usually less than N.

In the redundant memory area 10, four WLs may be used to form one repair unit. For example, the repair unit 0 includes RWL0, RWL1, RWL2 and RWL3. If two continuous WLs in the normal memory area 11 are damaged, four WLs of the repair unit in the redundant memory area can be used to replace the two damaged WLs and the two adjacent WLs (that is, four WLs in total are replaced). Or, if two continuous WLs in the normal memory area 11 are damaged, a normal unit(s) corresponding to the two WLs may be determined, and all WLs of the normal unit(s) corresponding to the two WLs are replaced with the repair unit as the unit.

However, it is further found by the inventor that typically only the first WL in the repair unit adjacent to the normal memory area in the redundant memory area has an influence on the normal memory area; and corresponding to FIG. 1, that is, the RWL0 of the repair unit 0 in the redundant memory area 10 usually has the row hammer problem. In a case where the repair unit 0 further includes RWL1, RWL2 and RWL3, these three WLs also do not participate in the repair operation. Therefore, the available resources are wasted.

In view of this, in some embodiments of the disclosure, a solution in which rest WLs other than the WL adjacent to the normal memory area in the above repair unit 0 can participate in the repair process is proposed, to improve the utilization rate of the redundant memory area.

Specifically, an exemplary embodiment of the disclosure provides a repair circuit. The repair circuit is disposed in a memory. The memory may be, for example, the DRAM. The memory may further be a Double Data Rate Fourth Synchronous Dynamic Random Access Memory (DDR4 SDRAM). There are no limits made on the type of the memory in the disclosure.

The memory may include a normal memory area and a redundant memory area. The redundant memory area is configured to repair an abnormity when a memory cell in the normal memory area is abnormal. The abnormity of the memory cell may refer to a case where a normal read-write service cannot be provided due to a short circuit or an open circuit in manufacture or later use. The normal memory area and the redundant memory area are exemplarily illustrated in FIG. 1, and are not repeatedly described.

In the exemplary embodiment of the disclosure, a repair unit immediately adjacent to the normal memory area in the redundant memory area is referred to as a target repair unit. In the exemplary example of FIG. 1, the target repair unit corresponds to the repair unit 0.

Figure 2:
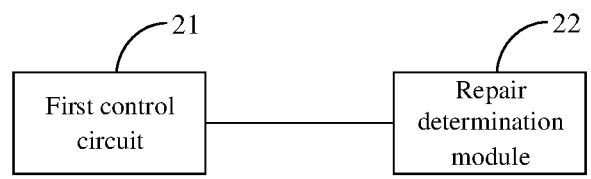
FIG. 2 illustrates a schematic diagram of a repair circuit according to an exemplary embodiment of the disclosure.

The repair circuit provided by the exemplary embodiment of the disclosure may be configured to selectively control the target repair unit to repair the abnormal memory cell in the normal memory area. Referring to FIG. 2, the repair circuit may include a first control circuit 21 and a repair determination module 22.

The first control circuit 21 may be configured to receive signals at the target number of bits from low to high in an input row address. For example, in a case where the row address is 12 bits and is characterized as <11:0>, being from low to high refers to from the $0^{th}$ bit to the $11^{th}$ bit.

In addition, the target number is associated with the number of WLs in the target repair unit. If the number of WLs in the target repair unit is $2^n$, the target number is n, the n being a positive integer greater than or equal to 2. For example, in a case where the repair unit illustrated in FIG. 1 includes 4 WLs, the target number is 2. However, it is to be understood that for different memories, the repair unit may include 8 or 16 WLs, and the target number is 3 or 4, respectively.

After receiving the signals at the target number of bits from low to high in the row address, the first control circuit 21 may process these signals to obtain a control result and output the control result. The control result in the embodiment of the disclosure may be a high-level or low-level signal.

The repair determination module 22 is connected to an output terminal of the first control circuit 21, and configured to receive the control result from the first control circuit 21 and output, in combination with the control result, a repair signal indicating whether to perform a repair operation. That is, the repair determination module 22 may output, in combination with one control result, a repair signal indicating that the repair operation is to be performed, so as to control the target repair unit to repair the abnormal memory cell in the normal memory area. Alternatively, the repair determination module 22 may output, in combination with another control result, a repair signal indicating that no repair operation is to be performed. In this case, a rest repair unit other than the target repair unit in the redundant memory area may be used to repair the abnormal memory cell in the normal memory area.

It is to be noted that in a case where the signals at the target number of bits are all at the low level, the following may be obtained: the repair determination module 22 outputs the repair signal of not executing the repair operation.

In a case where at least one of the signals at the target number of bits is at the high level, a result on whether the row address is matched with a fuse address may further be combined to determine whether to use the target repair unit to repair the abnormal memory cell in the normal memory area.

Specifically, when the row address is matched with the fuse address, that is, signals at bits corresponding to the row address and the fuse address are the same, the target repair unit is used to repair the abnormal memory cell in the normal memory area. When the row address is not matched with the fuse address, no processing is performed.

Figure 3:
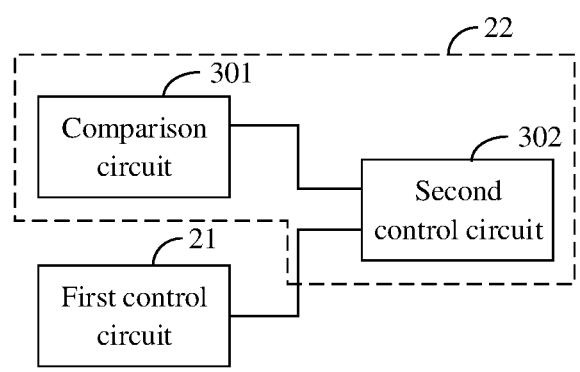
FIG. 3 illustrates a schematic diagram of a repair determination module including a comparison circuit and a second control circuit in a repair circuit according to an exemplary embodiment of the disclosure.

Referring to FIG. 3, the repair determination module 22 further includes a comparison circuit 301 and a second control circuit 302.

The comparison circuit 301 is configured to receive signals at rest bits other than the target number of bits in the row address. Still with the case where the row address is 12 bits and is characterized by <11:0> as an example, if the repair unit includes 4 WLs, that is, the target number is 2, the signals at the rest bits other than the target number of bits in the row address are <11:2>. The signals at the $0^{th}$ bit and the 1st bit are the input of the first control circuit 21.

In addition, the comparison circuit 301 is further configured to receive the fuse address, compare the signals at the rest bits with the fuse address bit by bit to obtain multiple comparison results, and output the comparison results. For example, in a case where each of the row address and the fuse address is 12 bits, <11:2> signals of the row address are compared with <11:2> signals of the fuse address bit by bit. For example, the 2nd bit of the row address is compared with the 2nd bit of the fuse address, the 3rd bit of the row address is compared with the 3rd bit of the fuse address, and the like. In this case, the comparison circuit 301 may output 10 comparison results. It is to be understood that the comparison result in the embodiment of the disclosure may also be a high-level or low-level signal. Specifically, in a case where the signals at the corresponding bits are the same, the comparison result is the high level; and in a case where the signals at the corresponding bits are different, the comparison result is the low level.

The second control circuit 302 is connected to an output terminal of the first control circuit 21 and an output terminal of the comparison circuit 301. The second control circuit 302 is configured to receive the above control result and multiple comparison results, process the control result and multiple comparison results, and output a repair signal indicating whether to perform a repair operation.

According to some embodiments of the disclosure, the first control circuit 21 may include the target number of NOT gates and an NAND gate.

Specifically, an input terminal of each NOT gate receives a respective one of the signals at the target number of bits from low to high in the row address. An input terminal of the NAND gate is connected to an output terminal of each NOT gate, and an output terminal of the NAND gate is connected to the second control circuit 302, and configured to output the above control result to the second control circuit 302.

The comparison circuit 301 includes multiple XNOR gates, and the number of the XNOR gates is the same as the number of the signals at the rest bits other than the target number of bits in the row address. Each XNOR gate includes a first input terminal and a second input terminal, the first input terminal receives a respective one of the signals at the rest bits other than the target number of bits in the row address, the second input terminal receives a corresponding bit of the fuse address, and an output terminal of each XNOR outputs a responsive one of the multiple comparison results.

The second control circuit 302 includes an AND gate; the AND gate includes multiple first input terminals and a second input terminal; and the number of the first input terminals is the same as the number of the XNOR gates in the comparison circuit 301. Each first input terminal is connected to an output terminal of a respective XNOR gate, and the second input terminal is connected to the output terminal of the NAND gate of the first control circuit 21. The output terminal of the AND gate outputs a repair signal indicating whether to perform a repair operation.

Figure 4:
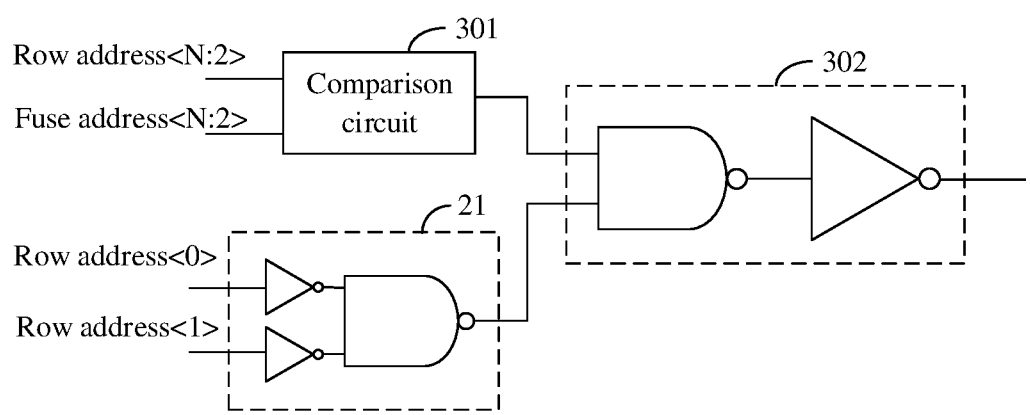
FIG. 4 illustrates a schematic diagram of a specific form of a first control circuit and a second control circuit according to some embodiments of the disclosure.

Referring to FIG. 4, with a case where the repair unit includes 4 WLs as an example, the specific forms of the first control circuit 21 and the second control circuit 302 will be described below.

Referring to FIG. 4, the first control circuit 21 includes two NOT gates that respectively receive the row address <0> and the row address <1>. Outputs of the two NOT gates are used as the input of the NAND gate, and the output of the NAND gate is the control result described above.

Due to limitations of manufacture procedure and other restraints of the process, the AND gate of the second control circuit 302 is usually configured as a cascaded form of one NAND gate and one NOT gate. The input terminal of the NAND respectively receives each comparison result output by the comparison circuit 301 and the control result output by the first control circuit 21.

In a case where the row address has N+1 bits in total, the signal received by the comparison circuit 301 is the row address <N:2> and the fuse address <N:2>.

Figure 5:
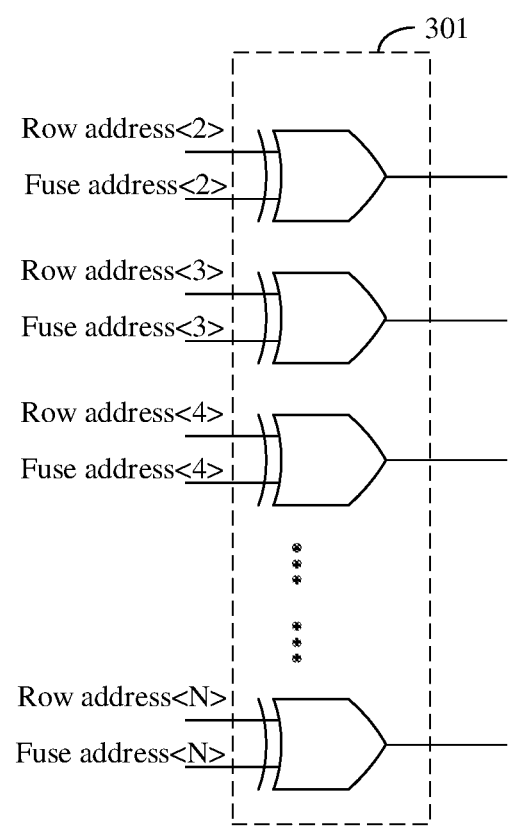
FIG. 5 illustrates a schematic diagram of a comparison circuit according to some embodiments of the disclosure.

FIG. 5 illustrates a structural schematic diagram of the comparison circuit 301. Referring to FIG. 5, the input of each XNOR gate is one bit of signal in the row address and the signal at the corresponding bit in the fuse address.

In addition, the output of each XNOR gate may further be input to one AND gate (not shown); and the output of the AND gate is used as the output of the comparison circuit 301 to forward to the second control circuit 302.

It is easily understood by those skilled in the art that in a case where there are multiple fuse addresses, the input row address is respectively compared with each fuse address.

For the fuse address input to the comparison circuit, the fuse address storage module of the disclosure will be exemplarily described below with reference to FIG. 6.

The fuse address storage module involved in the disclosure may be configured as an electronic programming fuse (E-fuse) module, and configured to store an address of a damaged WL in the normal memory area. It is to be noted that a correspondence between a storage position of the fuse address storage module and a repair unit of the redundant memory area may be configured in advance. For the memory cell of the normal memory area in which the first WL is damaged, the address of the WL cannot be stored at the storage position corresponding to the target repair unit in the fuse address storage module.

Figure 6:
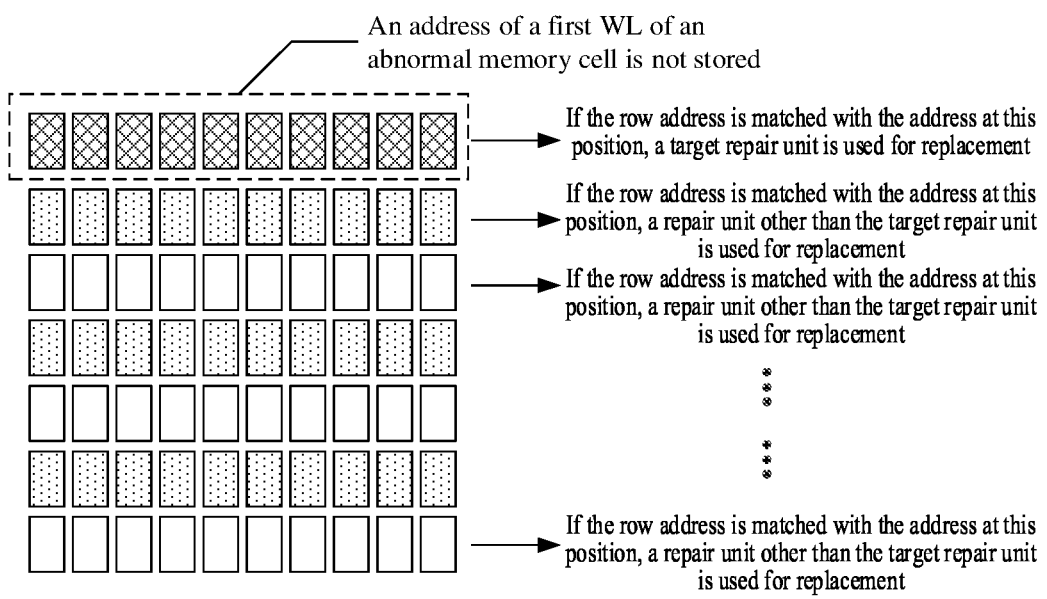
FIG. 6 illustrates a schematic diagram for describing a fuse address storage module according to some embodiments of the disclosure.

Referring to FIG. 6, for the storage position where the address of the first WL of the abnormal memory cell is not stored, if the row address is matched with the address stored at this position, the target repair unit may be used to replace the abnormal memory cell. For other memory addresses, rest repair units other than the target repair unit in the redundant memory area may be used for replacement. There are no limits made by the disclosure on which repair unit is specifically used.

In addition, in a case where the target repair unit is used to replace the abnormal memory cell, as the first WL in the target repair unit cannot be used, only rest WLs of the target repair unit are used to replace corresponding WLs of the abnormal memory cell, and the abnormal memory cell retains the first WL.

Figure 7:
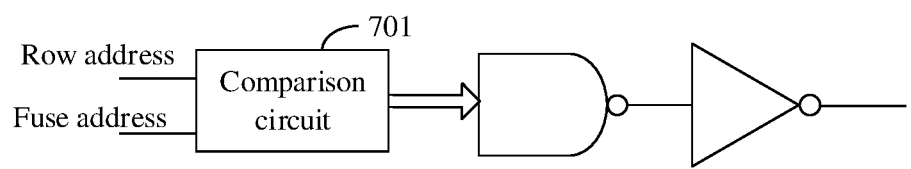
FIG. 7 illustrates a schematic diagram of a repair circuit applied to repair units other than a target repair unit in a redundant memory area according to some embodiments of the disclosure.

Referring to FIG. 7, a repair circuit for the rest repair units other than the target repair unit in the redundant memory area may include a comparison circuit 701, an NAND gate and a NOT gate that are cascaded. Similar to the above comparison circuit 301, the comparison circuit 701 is configured to compare the input row address and the fuse address, which will not be repeatedly described thereto.

A manner for repairing the memory cell in an embodiment of the disclosure will be described below with reference to FIG. 8.

In the redundant memory area 80, each repair unit includes four WLs. The RWL0 in the repair unit 0 cannot be used to replace the WL in the normal memory area due to the limitation of the row hammer problem. In the normal memory area 81, each normal unit includes four WLs.

Figure 8:
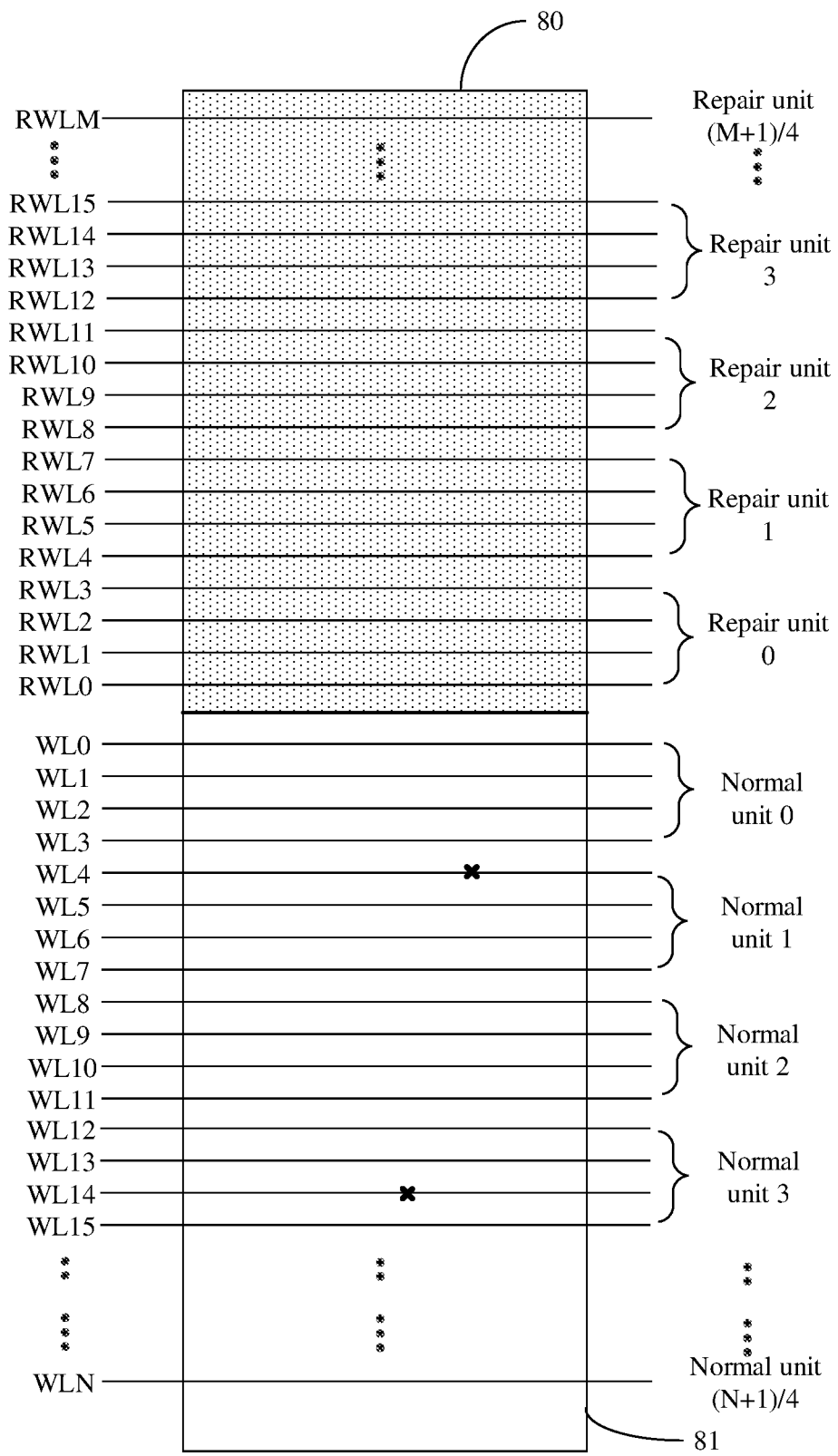
FIG. 8 illustrates a schematic diagram of a manner for repairing a memory cell according to an embodiment of the disclosure.

As illustrated in FIG. 8, the first WL, i.e., WL4 in the normal unit 1 is abnormal. In this case, based on the repair solution in the exemplary embodiment of the disclosure, as the first WL is damaged, the repair unit 0 cannot be used for replacement, and any repair unit other than the repair unit 0 may be used to replace the normal unit 1.

The third WL, i.e., WL14 in the normal unit 3 is abnormal. In this case, based on the repair solution in the exemplary embodiment of the disclosure, the repair unit 0 may be used for replacement. Specifically, the RWL1, RWL2 and RWL3 in the repair unit 0 are used to replace the WL13, WL14 and WL15 in the normal unit 3, respectively, while the WL12 in the normal unit 3 is used normally.

It is to be noted that when the third WL, i.e., WL14 in the normal unit 3 is abnormal, any repair unit other than the repair unit 0 may also be used to replace the normal unit 3.

The disclosure may configure repair priorities for the target repair unit (i.e., the repair unit 0 in the figure) and rest repair units. As the rest repair units other than the target repair unit in the redundant memory area are not limited in application range, when there is a memory cell to be repaired, whether the target repair unit may be used for repair may be determined preferentially; and if the target repair unit cannot be used for repair, the rest repair units are then used. In this case, the rest repair units having the wider application range are retained, that is, the problem that the abnormal memory cell cannot be repaired due to a fact that the rest repair units are occupied preferentially is avoided.

Based on the repair circuit in the exemplary embodiment of the disclosure, whether the target repair unit adjacent to the normal memory area in the redundant memory area is used for performing the repair operation is determined with information of the row address, that is, when the information of the row address meets the requirements, the target repair unit may be used to replace the abnormal memory cell. Therefore, compared with the solution in which the target repair unit is not used for repair in some technologies, the exemplary embodiment of the disclosure may improve the utilization rate of the redundant memory area.

Further, the disclosure further provides a memory including the above repair circuit.

Figure 9:
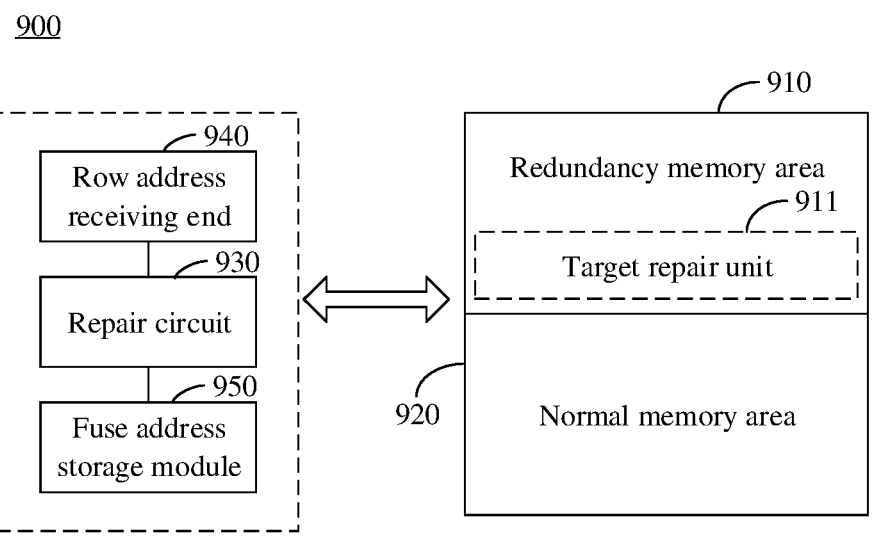
FIG. 9 illustrates a schematic diagram of a memory according to an exemplary embodiment of the disclosure.

Referring to FIG. 9, the memory 900 may include a redundant memory area 910, a normal memory area 920, a row address receiving end 940 and a repair circuit 930.

The redundant memory area 910 includes a target repair unit 911 adjacent to the normal memory area. The repair circuit 930 is configured to receive a row address from the row address receiving end 940, and control, according to the received row address, the target repair unit 911 to repair an abnormal memory cell in the normal memory area 920; and the specific implementation of the repair circuit 930 is as described above, and will not be repeatedly described.

It is to be noted that though not illustrated, the memory 900 may further include a repair circuit for rest repair units other than the target repair unit 911 in the redundant memory area 910.

In addition, the memory 900 may further include a fuse address storage module 950, configured to store an address of a WL corresponding to the abnormal memory cell in the normal memory area as a fuse address. The target repair unit 911 may receive the fuse address, to output a repair signal indicating whether to perform a repair operation.

In a storage unit, corresponding to the target repair unit, of the fuse address storage module 950, an address of a first WL in the abnormal memory cell is not stored.

Compared with a memory in which the target repair unit is not used for repair in some technologies, the memory including the repair circuit according to the exemplary embodiment of the disclosure may improve the utilization rate of the redundant memory area. With comparisons on multiple groups of experiments, the memory according to the exemplary embodiment of the disclosure improves the yield by about 6%.

Further, the disclosure provides a repair method. The repair method is applied to a memory including a normal memory area and a redundant memory area. The redundant memory area includes a target repair unit adjacent to the normal memory area.

Figure 10:
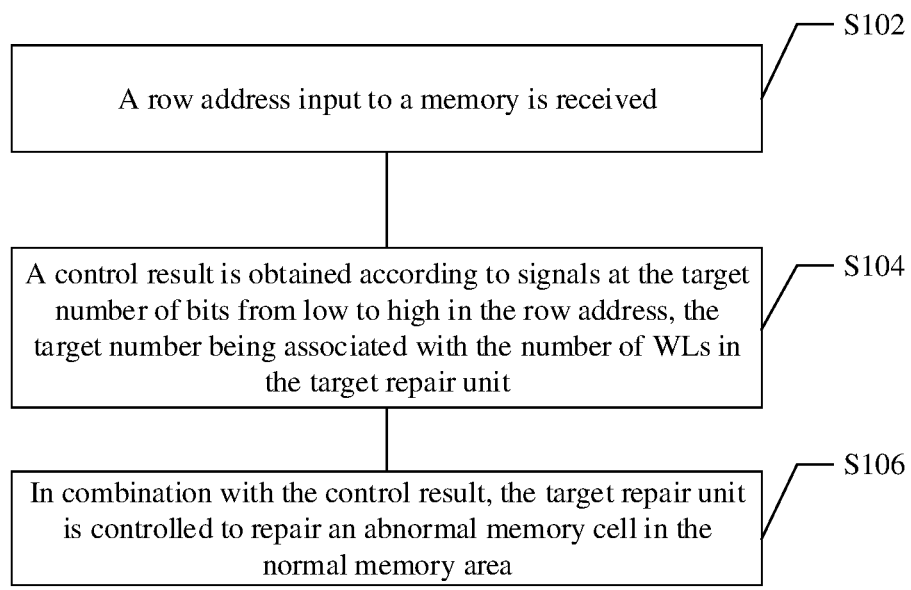
FIG. 10 illustrates a flowchart of a repair method according to an exemplary embodiment of the disclosure.

Referring to FIG. 10, the repair method according to the exemplary embodiment of the disclosure may include the following operations.

In S102, a row address input to a memory is received.

In S104, a control result is obtained according to signals at a target number of bits from low to high in the row address, where the target number is associated with the number of WLs in the target repair unit.

In S106, in combination with the control result, the target repair unit is controlled to repair an abnormal memory cell in the normal memory area.

According to the exemplary embodiment of the disclosure, the operation that in combination with the control result, the target repair unit is controlled to repair the abnormal memory cell in the normal memory area in S106 may include that: signals at rest bits other than the target number of bits in the row address are determined; a fuse address corresponding to the abnormal memory cell in the normal memory area is received; the signals at the rest bits are compared with the fuse address bit by bit to obtain multiple comparison results; and according to the multiple comparison results and the control result, the target repair unit is controlled to repair the abnormal memory cell in the normal memory area.

According to the exemplary embodiment of the disclosure, in a case where the multiple comparison results are that each of the signals at the rest bits is matched with a corresponding bit of the fuse address, if at least one signal among the signals at the target number of bits from low to high in the row address is at a high level, the abnormal memory cell is repaired with the target repair unit; and if the signals at the target number of bits from low to high in the row address are all at a low level, the abnormal memory cell is repaired with a repair unit other than the target repair unit in the redundant memory area.

According to the exemplary embodiment of the disclosure, the operation that the abnormal memory cell is repaired with the target repair unit may include that: a WL corresponding to the abnormal memory cell is replaced with a WL other than a first WL in the target repair unit; and a first WL of the abnormal memory cell is retained. The first WL of the target repair unit is a WL adjacent to the normal memory area.

Based on the repair method in the exemplary embodiment of the disclosure, whether the target repair unit adjacent to the normal memory area in the redundant memory area is used to execute the repair operation is determined with information of the row address, that is, when the information of the row address meets the requirements, the target repair unit may be used to replace the abnormal memory cell in the normal memory area. Therefore, compared with the solution in which the target repair unit is not used for repair in some technologies, the exemplary embodiment of the disclosure may improve the utilization rate of the redundant memory area.

Other embodiments of the disclosure will be apparent to those skilled in the art from consideration of the specification and practice of the disclosure disclosed herein. This application is intended to cover any variations, uses, or adaptations of the disclosure following the general principles thereof and including such departures from the disclosure as come within known or customary practice in the art. The specification and embodiments are considered as exemplary only, with a true scope and spirit of the disclosure being indicated by the claims.

It will be appreciated that the disclosure is not limited to the exact construction that has been described above and illustrated in the accompanying drawings, and that various modifications and changes may be made without departing from the scope thereof. The scope of the disclosure only be limited by the appended claims.

The invention claimed is:

1. A repair circuit, disposed in a memory comprising a normal memory area and a redundant memory area, wherein the redundant memory area comprises a target repair unit immediately adjacent to the normal memory area, the repair circuit is configured to control the target repair unit to repair an abnormal memory cell in the normal memory area, and the repair circuit comprises:
   a first control circuit, configured to receive signals at a target number of bits from low to high in a row address, process the signals at the target number of bits to obtain a control result, and output the control result, wherein the target number is associated with a number of Word Lines (WLs) in the target repair unit; and
   a repair determination circuitry, connected to an output terminal of the first control circuit, and configured to receive the control result and output, in combination with the control result, a repair signal indicating whether to perform a repair operation,
   wherein the target repair unit comprises a plurality of WLs, and is configured to:
      replace WLs corresponding to the abnormal memory cell with remaining WLs of the plurality of WLs other than a first WL of the plurality of WLs in the target repair unit, wherein the first WL in the target repair unit is a WL adjacent to the normal memory area; and
      retain a first WL of the WLs corresponding to the abnormal memory cell, the first WL of the WLs corresponding to the abnormal memory cell being a WL more adjacent to the target repair unit than remaining WLs of the WLs corresponding to the abnormal memory cell, wherein the first WL of the WLs corresponding to the abnormal memory cell is not damaged.

2. The repair circuit of claim 1, wherein the repair determination circuitry comprises:
   a comparison circuit, configured to receive signals at remaining bits other than the target number of bits in the row address, receive a fuse address, compare the signals at the remaining bits with the fuse address bit by bit to obtain a plurality of comparison results, and output the plurality of comparison results; and
   a second control circuit, connected to the output terminal of the first control circuit and an output terminal of the comparison circuit, and configured to receive the control result and the plurality of comparison results, process the control result and the plurality of comparison results, and output the repair signal indicating whether to perform the repair operation.

3. The repair circuit of claim 2, wherein the first control circuit comprises:
   the target number of NOT gates, an input terminal of each of the target number of NOT gates receiving a respective one of the signals at the target number of bits from low to high in the row address; and
   an NAND gate, an input terminal of the NAND gate being connected to an output terminal of each of the target number of NOT gates, and an output terminal of the NAND gate being connected to the second control circuit, and configured to output the control result.

4. The repair circuit of claim 3, wherein the comparison circuit comprises:
   a plurality of XNOR gates, wherein a number of the plurality of XNOR gates is the same as a number of the signals at the remaining bits other than the target number of bits in the row address, a first input terminal of each of the plurality of XNOR gates receives a respective one of the signals at the remaining bits other than the target number of bits in the row address, a second input terminal of the each XNOR gate receives a corresponding bit of the fuse address, and an output terminal of the each XNOR gate outputs a respective one of the plurality of comparison results.

5. The repair circuit of claim 4, wherein the second control circuit comprises:
   an AND gate, wherein a plurality of first input terminals of the AND gate are connected to output terminals of the plurality of XNOR gates, respectively, a second input terminal of the AND gate is connected to the output terminal of the NAND gate, and an output terminal of the AND gate outputs the repair signal indicating whether to perform the repair operation.

6. The repair circuit of claim 1, wherein when a number of WLs in the target repair unit is $2^n$, the target number is n, the n being a positive integer greater than or equal to 2.

7. The repair circuit of claim 1, wherein when the signals at the target number of bits are all at a low level, the repair signal output by the repair determination circuitry indicates that no repair operation is to be performed.

8. A memory, comprising:
   a normal memory area;
   a redundant memory area, comprising a target repair unit immediately adjacent to the normal memory area;
   a row address receiving end, configured to receive a row address input to the memory; and
   a repair circuit, configured to control the target repair unit to repair an abnormal memory cell in the normal memory area,
   wherein the repair circuit comprises:
      a first control circuit, configured to receive signals at a target number of bits from low to high in a row address, process the signals at the target number of bits to obtain a control result, and output the control result, wherein the target number is associated with a number of Word Lines (WLs) in the target repair unit; and a repair determination circuitry, connected to an output terminal of the first control circuit, and configured to receive the control result and output, in combination with the control result, a repair signal indicating whether to perform a repair operation, wherein the target repair unit comprises a plurality of WLs, and is configured to:

replace WLs corresponding to the abnormal memory cell with remaining WLs of the plurality of WLs other than a first WL of the plurality of WLs in the target repair unit, wherein the first WL in the target repair unit is a WL adjacent to the normal memory area; and retain a first WL of the WLs corresponding to the abnormal memory cell, the first WL of the WLs corresponding to the abnormal memory cell being a WL more adjacent to the target repair unit than remaining WLs of the WLs corresponding to the abnormal memory cell, wherein the first WL of the WLs corresponding to the abnormal memory cell is not damaged.

9. The memory of claim 8, further comprising:
a fuse address memory, configured to store an address of a WL corresponding to the abnormal memory cell in the normal memory area as a fuse address,
wherein the repair circuit is configured to receive the fuse address, to output the repair signal indicating whether to perform the repair operation.

10. The memory of claim 9, wherein in a storage unit, corresponding to the target repair unit, of the fuse address memory, an address of the first WL of the WLs corresponding to the abnormal memory cell is not stored.

11. The memory of claim 8, wherein the repair determination circuitry comprises:
a comparison circuit, configured to receive signals at remaining bits other than the target number of bits in the row address, receive a fuse address, compare the signals at the remaining bits with the fuse address bit by bit to obtain a plurality of comparison results, and output the plurality of comparison results; and
a second control circuit, connected to the output terminal of the first control circuit and an output terminal of the comparison circuit, and configured to receive the control result and the plurality of comparison results, process the control result and the plurality of comparison results, and output the repair signal indicating whether to perform the repair operation.

12. The memory of claim 11, wherein the first control circuit comprises:
the target number of NOT gates, an input terminal of each of the target number of NOT gates receiving a respective one of the signals at the target number of bits from low to high in the row address; and
an NAND gate, an input terminal of the NAND gate being connected to an output terminal of each of the target number of NOT gates, and an output terminal of the NAND gate being connected to the second control circuit, and configured to output the control result.

13. The memory of claim 12, wherein the comparison circuit comprises:
a plurality of XNOR gates, wherein a number of the plurality of XNOR gates is the same as a number of the signals at the remaining bits other than the target number of bits in the row address, a first input terminal of each of the plurality of XNOR gates receives a respective one of the signals at the remaining bits other than the target number of bits in the row address, a second input terminal of the each XNOR gate receives a corresponding bit of the fuse address, and an output terminal of the each XNOR gate outputs a respective one of the plurality of comparison results.

14. The memory of claim 13, wherein the second control circuit comprises:
an AND gate, wherein a plurality of first input terminals of the AND gate are connected to output terminals of the plurality of XNOR gates, respectively, a second input terminal of the AND gate is connected to the output terminal of the NAND gate, and an output terminal of the AND gate outputs the repair signal indicating whether to perform the repair operation.

15. The memory of claim 8, wherein when a number of WLs in the target repair unit is $2^n$, the target number is n, the n being a positive integer greater than or equal to 2.

16. The memory of claim 8, wherein when the signals at the target number of bits are all at a low level, the repair signal output by the repair determination circuitry indicates that no repair operation is to be performed.

17. A repair method, applied to a memory comprising a normal memory area and a redundant memory area, wherein the redundant memory area comprises a target repair unit immediately adjacent to the normal memory area, and the repair method comprises:
receiving a row address input to the memory;
obtaining a control result according to signals at a target number of bits from low to high in the row address, wherein the target number is associated with a number of Word Lines (WLs) in the target repair unit; and
controlling, in combination with the control result, the target repair unit to repair an abnormal memory cell in the normal memory area,
wherein controlling, in combination with the control result, the target repair unit to repair the abnormal memory cell in the normal memory area comprises:
determining signals at remaining bits other than the target number of bits in the row address;
receiving a fuse address corresponding to the abnormal memory cell in the normal memory area;
comparing the signals at the remaining bits with the fuse address bit by bit to obtain a plurality of comparison results; and
controlling, according to the plurality of comparison results and the control result, the target repair unit to repair the abnormal memory cell in the normal memory area,
wherein when the plurality of comparison results indicate that each of the signals at the remaining bits is matched with a corresponding bit of the fuse address, controlling, according to the plurality of comparison results and the control result, the target repair unit to repair the abnormal memory cell in the normal memory area comprises:
repairing, when at least one signal among the signals at the target number of bits from low to high in the row address is at a high level, the abnormal memory cell with the target repair unit,
wherein repairing the abnormal memory cell with the target repair unit comprises:
replacing WLs corresponding to the abnormal memory cell with remaining WLs other than a first WL in the target repair unit, wherein the first WL in the target repair unit is a WL adjacent to the normal memory area; and retaining a first WL of the WLs corresponding to the abnormal memory cell, the first WL of the WLs corresponding to the abnormal memory cell being a WL more adjacent to the target repair unit than remaining WLs of the WLs corresponding to the abnormal memory cell, wherein the first WL of the WLs corresponding to the abnormal memory cell is not damaged.

18. The repair method of claim 17, wherein when the plurality of comparison results are that each of the signals at the remaining bits is matched with a corresponding bit of the fuse address, controlling, according to the plurality of comparison results and the control result, the target repair unit to repair the abnormal memory cell in the normal memory area further comprises:

repairing, when the signals at the target number of bits from low to high in the row address are all at a low level, the abnormal memory cell with a repair unit other than the target repair unit in the redundant memory area.

\* \* \* \* \*